United States Patent [19]

Sugiyama et al.

[11] Patent Number: 4,532,619
[45] Date of Patent: Jul. 30, 1985

[54] METHOD AND APPARATUS FOR REDUCING SEMICONDUCTOR LASER OPTICAL NOISE

[75] Inventors: Toshio Sugiyama, Aichi; Hideo Suenaga, Toyokawa, both of Japan

[73] Assignee: Hitachi, Ltd., Tokyo, Japan

[21] Appl. No.: 460,015

[22] Filed: Jan. 21, 1983

[30] Foreign Application Priority Data

Jan. 22, 1982 [JP] Japan .................................. 57-7572
Apr. 7, 1982 [JP] Japan .................................. 57-56581
Apr. 28, 1982 [JP] Japan .................................. 57-70391

[51] Int. Cl.$^3$ .............................................. G11B 7/00
[52] U.S. Cl. ...................................... 369/106; 369/122
[58] Field of Search .............. 369/110, 112, 116, 122, 369/106, 100, 45

[56] References Cited

U.S. PATENT DOCUMENTS

| | | | |
|---|---|---|---|
| 4,333,173 | 6/1982 | Yonezawa et al. | 369/122 |
| 4,334,300 | 6/1982 | Arquie et al. | 369/122 |
| 4,345,321 | 8/1982 | Arquie et al. | 369/122 |
| 4,358,200 | 11/1982 | Heemskerk et al. | 369/45 |
| 4,375,680 | 3/1983 | Cahill et al. | 455/605 |

Primary Examiner—Donald McElheny, Jr.
Attorney, Agent, or Firm—Antonelli, Terry & Wands

[57] ABSTRACT

A method and apparatus is disclosed for reducing optical noise in an optical information processing system having a single longitudinal mode laser which is converged on a record medium for detecting information stored on the medium. A range from 1-10% of the total emitted light per facet of the laser is fed back to an emitting point of the laser to minimize the occurrence of optical noise present in the light emitted from the laser.

32 Claims, 17 Drawing Figures

METHOD AND APPARATUS FOR REDUCING SEMICONDUCTOR LASER OPTICAL NOISE

BACKGROUND OF THE INVENTION

1. Field of the Invention

The present invention relates to a method and an apparatus for reducing optical noise generated by a semiconductor laser in an optical information processing system such as an optical disc player which utilizes a semiconductor laser as a light source.

2. Description of the Prior Art

A single longitudinal mode semiconductor laser which oscillates at one wavelength has a very small astigmatism and hence can highly converge a light spot emitted from one facet of a device at an external record medium. For example, in an optical disc player, particularly a digital audio disc player, it is prescribed that a light spot diameter λ/NA on a disc surface is no larger than 1.75 μm. When the single longitudinal mode semiconductor laser is used, the light spot diamter λ/NA can be 0.79/0.47 = 1.68 μm. By converging the light spot in this manner, a recorded signal on the disc can be more exactly read.

However, in such a single longitudinal mode semiconductor laser, it has been known that when a light emitted from the one facet of the device is reflected by the external record medium and fed back to the emitting one facet, a light output fluctuates even if the laser device is driven by a constant current. An optical noise appears in reproducing a signal so that a signal cannot be detected with a high fidelity.

Thus, in an optical information apparatus such as a fiber optic communication apparatus or an optical disc player which uses an semiconductor laser, an optical isolator is used to minimize a light fed back to the semiconductor laser device in order to prevent the semiconductor laser noise due to the feedback light. However, it is practically difficult to completely block the feedback light and a certain amount of feedback light to the semiconductor laser is inevitably included due to a precision error of the optical parts and a variation among the parts. The magnitude of the optical noise significantly changes when a small change occurs in the amount of feedback light. When the amount of feedback light reaches approximately 0.1% of the amount of emitted light, the optical noise abruptly increases. Accordingly, in the past, it has been required to increase the precision of the optical parts, reduce the variation among the parts and increase the precision in assembly of the parts. Therefore, the prior art apparatus is not suitable for mass production.

FIG. 1a shows a basic construction of an optical system of an optical disc player pickup. A laser beam emitted from an emitting point 8 of a semiconductor laser 1 is collimated by a coupling lens 2. The collimated light beam passes through a polarization beamsplitter 3 and a quarter wave plate 4 and then is converged by a objective lens 5 into a light spot 9 on a reflection plane 6 of the disc. The light reflected by the reflection plane 6 again passes through the objective lens 5 and the quarter wave plate 4; is deflected normally by the polarization beamsplitter 3; and then reaches a light detector 7 which converts the light to an electric signal.

In the prior art, when the semiconductor laser of this type is used, the combination of the quarter wave plate 4 and the polarization beamsplitter 3 is principally designed to prevent the feedback of the reflected light from the disc to the semiconductor laser. As shown in FIG. 1b, the linearly polarized light beam emitted from the semiconductor laser is applied to the quarter wave plate 4a with a polarization plane thereof being at 45 degrees to a crystal axis of the quarter wave plate so that the laser beam passed through the quarter wave plate is circularly polarized. When this laser beam is reflected by the reflection plane and again passes through the quarter wave plate, it is linearly polarized with the polarization plane thereof being rotated by 90 degrees with respect to that of the original beam. The light beam having the polarization of 90 degrees does not transmit through the polarization beamsplitter but it is reflected thereby so that the light beam is not fed back to the semiconductor laser. However, it is inevitable that the laser beam is fed back to the emitting point 8 because of a precision error of the optical parts, a precision error in the assembly of the optical parts and an optical anisotropy (birefraction). For example, assuming that a ratio of light distributed to the light detector 7 to that to the semiconductor laser 1 is 200 when the reflected light from the reflection plane 6 of the disc in FIG. 1a is best directed to the light detector 7 by the polarization beamsplitter 3 and a coupling efficiency between the semiconductor laser 1 and the coupling lens 2. That is, a ratio of a total amount of light emitted forwardly of the semiconductor laser to the amount of light passed through the coupling lens 2 is 20% and a reflection factor of the reflection plane is 90%, approximately 0.09–0.1% of the light emitted forwardly of the semiconductor laser is fed back to the emitting point 8. This feedback light causes the increase of the optical noise. It is, therefore, necessary to precisely control the tolerance of the optical parts and the variation among the parts to minimize the amount of feedback light.

SUMMARY OF THE INVENTION

It is an object of the present invention to provide a method and an apparatus for increasing an S/N ratio (signal-to-noise ratio) in an optical information processing system which uses a single longitudinal mode semiconductor laser as a light source.

In order to achieve the above object, in accordance with the present invention, 1–10% of the total amount of light emitted per one facet of the semiconductor laser is fed back to the emitting point of the semiconductor laser in the optical information processing apparatus which uses the single longitudinal mode semiconductor laser as the light source.

DESCRIPTION OF THE PREFERRED EMBODIMENTS

As described above, in the optical information processing apparatus which uses the single longitudinal mode semiconductor laser as the light source, the light output fluctuates when the light is fed back to the laser device which causes the optical noise. Accordingly, in the prior art, an effort has been made to prevent the feedback of the light.

Figure 2:
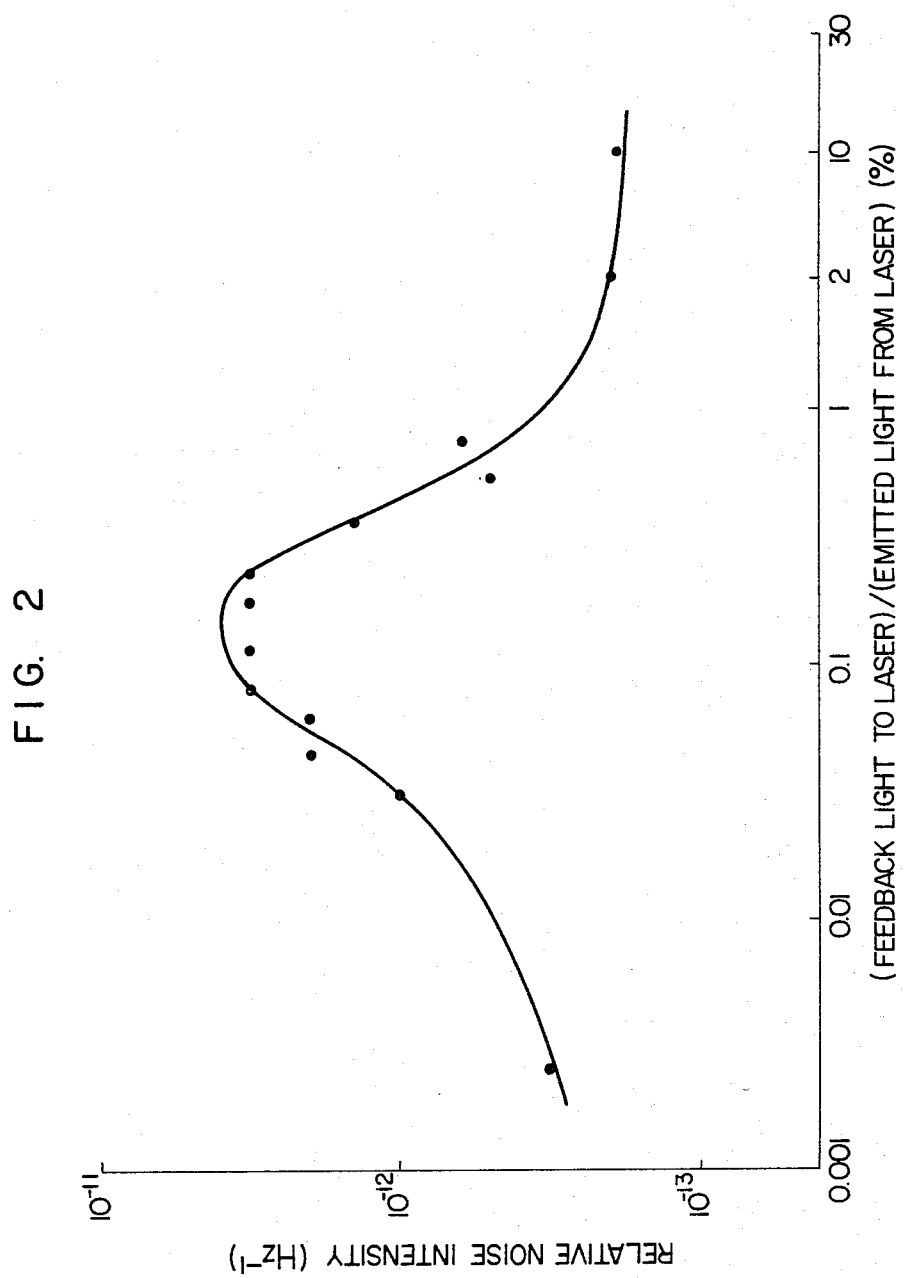
FIG. 2 shows the relation between the amount of feedback light to a semiconductor laser and a laser noise level.

However, according to detailed study of a relation between the amount of feedback light and the optical noise in the semiconductor laser made by the inventor of the present invention, it has been found that noise level does not linearly increase with the amount of feedback light but exhibits a peak at a certain amount of feedback light and decreases as the amount of feedback further increases. An example thereof is shown in FIG. 2, in which the abscissa represents a feedback light factor, that is, a ratio of the amount of feedback light to the emitting point of the device to the total amount of light emitted per one facet of the single longitudinal mode semiconductor laser, and the ordinate represents a plot of maximum relative noise intensities per band width of 1 kHz with a D.C. output being unity when the temperature changes 20° C. up to 60° C., for the laser beam detected by the light detector. Thus, a relative noise intensity of $10^{-13}$ corresponds to an S/N ratio of 90 dB when measured in a band width of 10 kHz ($10^4$ Hz).

Figure 3A:
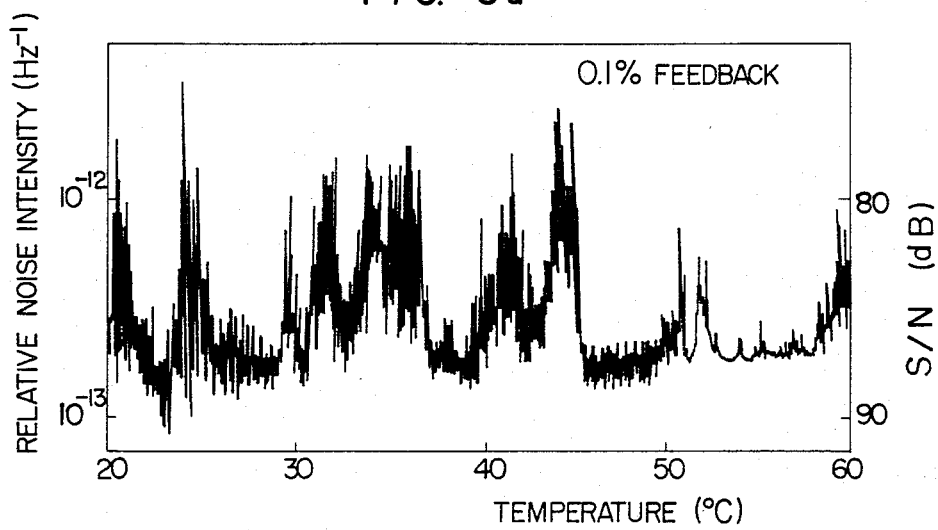
FIGS. 3a and 3b illustrate an effect of noise reduction by the feedback light.
Figure 3B:
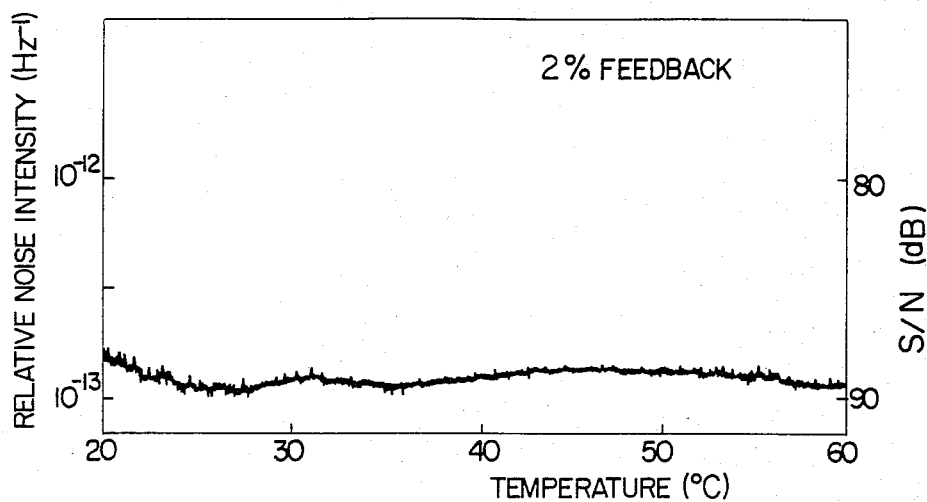

FIG. 3a shows the change of the relative noise intensity for a 0.1% feedback factor with the abscissa representing a temperature. FIG. 3b shows a similar change for 2% feedback factor.

Figure 1A:
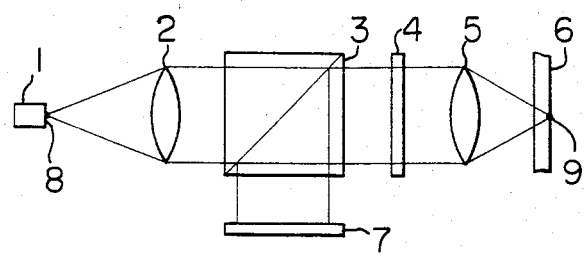
FIGS. 1a and 1b show an optical pickup.

Measurement was done in the following manner. In FIG. 1a, the disc is substituted by a mirror and a ratio of light feedback is set at a level by the rotation of the quarter wave plate 4. The output of the light detector 7 is supplied to an amplifier and the amplified output is passed through a band-pass filter to eliminate a noise component of 500 kHz. The output of the filter is supplied to an X-Y recorder. A light output of the single longitudinal mode semiconductor laser 1 is kept at 3 milli-watts and the laser 1 is mounted on a Pétier device with the device temperature being changed from 20° C. to 60° C. by a Pétier controller. A change of laser temperature is measured by a thermometer, an output of which is supplied to an X-axis of the X-Y recorder to measure the noise level. The ratio of the amount of feedback light is selected by rotating the quarter wave plate 4. FIG. 3a shows a change of the relative noise intensity for a 0.5% feedback. FIG. 3b shows a change for a 2% feedback. FIG. 2 shows a plot of maximum noise levels measured when the feedback factor changes.

It is seen from FIG. 2 that the peak of the noise is in the vicinity of 0.1% of the feedback light factor, and when the feedback light factor further increases, the noise reduces and the change of noise is small. The curve of FIG. 2 slightly changes as a function of the laser device, the optical distance between the one facet of the laser, and the reflection plane. When the amplitude feedback light factor is larger than 1%, it is beyond the peak of the noise in most cases and the variation of noise is small.

In FIGS. 3a and 3b, the noise intensity with the light feedback of 2% is more than 10 dB lower than that of 0.1% feedback and hence it is effective to reduce the noise.

Accordingly, the noise can be reduced not by reducing the feedback light factor as is done in the prior art but by increasing it to 1% or more so that the semiconductor laser is operated on the right side of the peak. In this case, the variation of the optical noise is small when the feedback light factor is increased. Accordingly, by increasing the feedback light factor, less precision of the optical parts is required and substantially constant optical noise intensity is obtained even if the amount of feedback shifts due to the variation among the parts. Therefore, the present apparatus is suited to mass production.

When the feedback light factor is increased more, no problem arises with the laser noise but the amount of signal light reduces relatively and the S/N ratio in an electric system becomes a problem. Accordingly, the feedback light factor is preferably between 1% and 10%, and more preferably between 1% and 3% of the S/N ratio.

The feedback light factor is calculated based on a coupling efficiency $\eta$ of the coupling lens and the efficiency of the optical parts as follows. Thus, the optical system is designed so that the feedback light factor is between 1% and 10%.

Embodiments of the present invention are now explained with reference to the drawings.

Figure 4A:
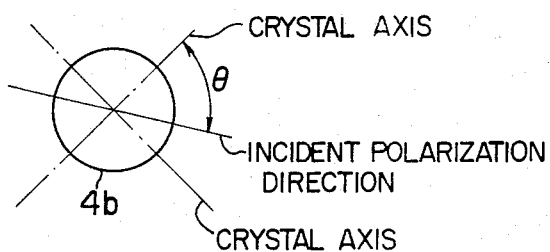
FIGS. 4a and 4b show the relation between a set angle of a quarter wave plate and the amount of feedback light.

In a first embodiment, the construction of the optical system remains the same as that of FIG. 1a and an angle $\theta$ between a polarization plane of the laser beam applied to the quarter wave plate and a crystal axis of the quarter wave plate is rotated by 45 degrees from the standard angle as shown in FIG. 4a to attain a predetermined feedback.

In the system of FIG. 1a, when the quarter wave plate 4 is rotated around the optical axis of the optical system, at a transmission factor $T_3$ of the reflected light from the disc into the laser 1 through the polarization beamsplitter 3 is expressed by a function of $\theta$ as follows.

$$T_3 = \tfrac{1}{2}\{1 + \cos 4\theta\} \qquad (1)$$

Figure 4B:
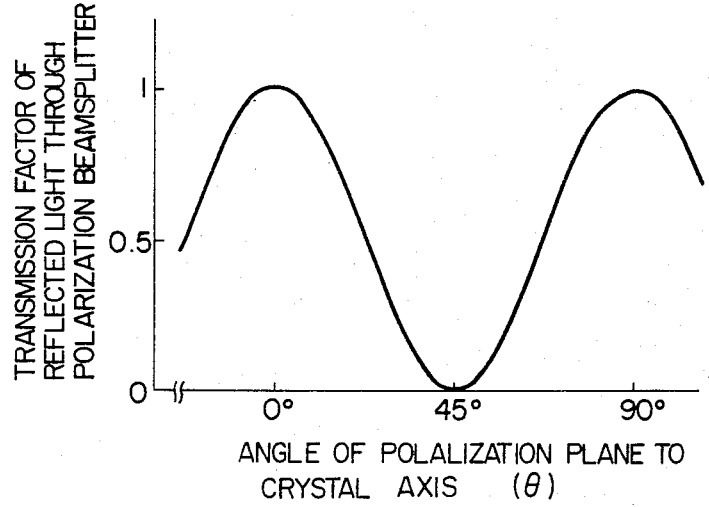

The above formula is graphically shown in FIG. 4b.

The feedback light factor F to the semiconductor laser is next calculated.

In FIG. 1a, let us assume that the coupling efficiency $\eta$ between the semiconductor laser 1 and the coupling lens 2 includes a loss $L_2$ of the coupling lens 2 in an optical path to the reflector plate 6. Optical losses due to surface reflection and attenuation in one way through the lenses 2 and 5, the polarization beamsplitter 3 and the quarter wave plate 4 are now represented by $L_2$, $L_5$, $L_3$ and $L_4$, respectively. A reflection factor at a mirror surface of the disc 6 is represented by $R_6$. The transmission factor of the reflected light from the disc into the laser 1 through the polarization beamsplitter 3 is represented by $T_3$. It is assumed that no other optical loss is included. In this system, the emitting point 8 of the semiconductor laser and the spot 9 on the disc are in a focusing relation with each other. Therefore, it can be considered that the light applied to the coupling lens 2 from the reflected light from the disc, less the loss $L_2$ by the lens 2 is returned to the emitting point 8.

Accordingly, the feedback light factor F to the laser is given by $$F = \eta \times (1-L_2) \times (1-L_3)^2 \times (1-L_4)^2 \times (1-L_5)^2 \times R_6 \times T_3 \quad (2)$$

Assuming that the coupling efficiency $\eta$ is 20% (numerical aperture of the coupling lens 2 is 0.15), the optical losses $L_2$, $L_3$, $L_4$ and $L_5$ are 1%, respectively, and the reflection factor $R_6$ is 0.9, we get $$F = 0.17 \times T_3 \quad (3)$$

Accordingly, in order for the feedback light factor to be more than 1%, $T_3$ is selected to 5.9% or more and the positioning angle $\theta$ of the quarter wave is 38° or 52° from the formula (1). Thus, the quarter wave plate is rotated by more than ±7° from the standard positioning angle.

When the feedback light factor of 2% is desired, $T_3$ is selected to be 12% and the positioning angle $\theta$ of the quarter wave plate is 35° or 55°. Thus, the quarter wave plate is rotated by approximately ±10° from the standard positioning angle so that the light amount of the light detector 7 is reduced by $T_3$ from the maximum.

When the feedback light factor is selected to the upper limit of 10%, $T_3$ is 58% and $\theta$ is 20° or 70° but the signal light amount is also reduced by $T_3$. Accordingly, when a large feedback light factor is selected, it is necessary to consider the compliance with the S/N ratio of other parts such as the electric system.

Figure 5:
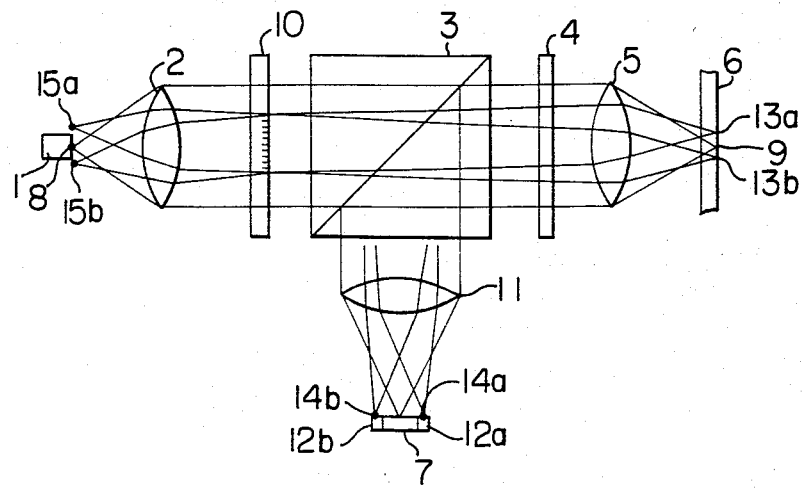
FIG. 5 shows an optical pickup which uses a diffraction grating.

The basic construction of FIG. 5 is similar to that of FIG. 1a except that an optical system includes a diffraction grating 10 and tracking error detecting light detectors 12a and 12b and a detecting lens 11 in order to attain so-called three-spot tracking in the optical disc player pickup. In the present optical system, a collimated laser beam emitted from the laser 1 passes through the diffraction grating 10 in which it is split into 0-order light, ±1-order lights and higher order light. The ±1-order lights produce spots 13a and 13b on both sides of a main spot 9 with a displacement of an approximately half of the main spot track width at opposite positions in the longitudinal direction of the track. The light detectors 12a and 12b detect reflected lights from the spots 13a and 13b to produce a tracking error from a differential signal. In such an optical system including the diffraction grating, when the light is returned to the laser 1 through the rotated quarter wave plate 4, a diffraction light is produced when the light passes through the diffraction grating 10 in its return path.

Therefore, a part of the reflected light from the main spot produces spots 15a and 15b on the same plane as the laser facet. Accordingly, when a diffraction grating is used in the optical system, the quantity of light which returns to the emitting point 8 due to diffraction is reduced. A part of the 1— and higher-order diffraction lights, for example, +1-order diffraction light in its incident path is reflected by the disk and is again diffracted by the diffraction grating to return to the emitting point. The light quantity which returns to the emitting point due to the 1— and higher-order diffraction lights is negligible in the calculation since it is generally small as compared with that due to the 0-order diffraction light. Accordingly, the feedback light factor is calculated in the following manner.

It is assumed that a factor $T_G$ of 0-order light transmission to an incident light when the laser beam passes through the diffraction grating is 0.7 and the other efficiencies of optical system are same as those in the previous example. Since $T_G$ is effective in both return and incident paths, the feedback light factor F is given by $$F = \eta \times (1 - L_2) \times (1 - L_3)^2 \times \quad (4)$$
$$(1 - L_4)^2 \times (1 - L_5)^2 \times R_6 \times T_G^2 \times T_3$$
$$= 0.08 \times T_3 \quad (5)$$

Thus, when F of more than 1% is desired, $T_3$ is selected to 12.5%, and the positioning angle $\theta$ of the quarter wave plate is 35° or 55°. That is, it is rotated by more than ±10° from the standard positioning angle. If F of more than 2% is desired, T is selected to 25% and $\theta$ is 30° or 60°, that is, the quarter wave plate is rotated by approximately ±15°.

In the three-spot system, when F is 8%, $\theta = 90°$ or 0°. Thus, in this example, a maximum of F is 8%.

Figure 6A:
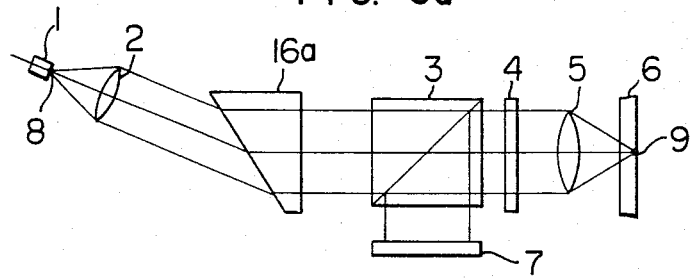
FIGS. 6a and 6b shows an optical pickup which uses a Brewster prism.
Figure 6B:
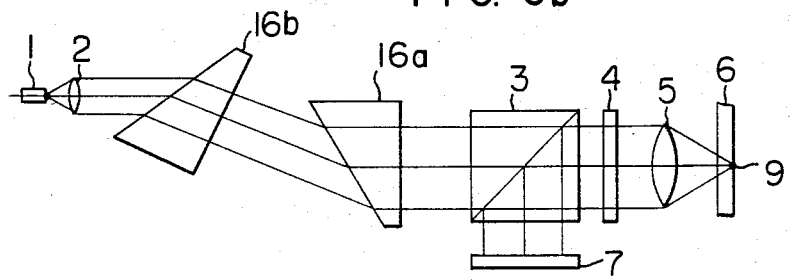

In general, a beam spread angle of the semiconductor laser in a thickness direction of the semiconductor laser chip is different from that in a normal direction. Thus, if all of the light beams emitted from the semiconductor laser are converged by the lens, the spot becomes elliptic and the light spot cannot be highly converged. In the examples of FIGS. 1a and 5, in order to make the light spot circular, the coupling lens 2 having a small numerical aperture is used so that only the central portion of the laser beam is utilized. In the embodiments of FIGS. 6a and 6b, one or two Brewster prisms 16a and 16b are used to shape the beam. Thus, the coupling lens 2 may have a relatively large numerical aperture such as 0.5 so that the light utilization efficiency is increased. A method for attaining a desired feedback light factor in this optical system is now explained.

In the embodiment of FIG. 6a, one Brewster prism 16a is used. It is assumed that the numerical aperture of the coupling lens 2 is 0.5 and $\eta$ is 80%. It is also assumed that a loss $L_{16}$ of the prism 16a is 2% in one way and the other efficiencies of the optical system is same as those in FIG. 1. The feedback light factor F is given by $$F = \eta \times (1 - L_2) \times (1 - L_3)^2 \times \quad (6)$$
$$(1 - L_4)^2 \times (1 - L_5)^2 \times (1 - L_{16})^2 \times R_6 \times T_3$$
$$= 0.65 \times T_3 \quad (7)$$

When F is 1%–10%, then $T_3$ is 1.5–15% and the quarter wave plate is rotated by ±3.5°–11.5°. At a standard feedback light factor of 2%, $T_3$ is 3% and $\theta$ is 40° or 50° and the quarter wave plate is rotated by approximately ±5°.

In the embodiment of FIG. 6b which uses two Brewster prisms, a similar calculation is carried out and the feedback light factor F of 1–10% is attained by $T_3$ of 1.6–16%. The rotation angle of the quarter wave plate is substantially the same as that when one Brewster prism is used, that is, ±3.5°–±12° at the standard feedback light factor of 2%, $T_3$ is 3.2% and the rotation angle of the quarter wave plate is ±5°.

As discussed above, when the numerical aperture of the coupling lens 2 is large, $T_3$ is 1.5% for $F=1\%$. Thus, when the polarization beamsplitter is of relatively low precision, that is, it has an extinction ratio of approximately 1.5%, the feedback light factor of approximately 1% may be automatically attained even if the quarter wave plate is at the standard positioning angle, that is, $\theta=45°$. However, it is desirable to rotate it by approximately 2% of the standard angle to give a margin.

When the diffraction grating 10 shown in FIG. 5 is further inserted into the optical system having the Brewster prism, the transmission factor $T_3$ of the polarization beamsplitter is determined by taking the 0-order light transmission factor $T_G^2$ in both ways into consideration.

In the above embodiments, it is assumed that the objective lens 5 facing the disc is fixed and the light loss in one way is 1%. In an actuator-operated system in which the objective lens can be moved in parallel to the disc plane by a tracking servo, the diameter of the objective lens 5 is reduced relative to a diameter of the coupling lens 2 to allow the parallel movement. Accordingly, it is necessary to fully consider a light intensity reduction by a real reduction. When the diameter of the coupling lens 2 is 5.5 mm and the diameter of the objective lens 5 is 4.3 mm, the output light intensity is approximately 0.6 times of the input light intensity. This should be taken into consideration in the above formula.

Thus far, the method for changing the transmission factor $T_3$ of the polarization beamsplitter by rotating the quarter wave plate around the optical axis of the optical system in order to attain the feedback light factor of 1–10% has been described. A desired $T_3$ can also be attained by arranging the quarter wave plate obliquely to the incident light axis. An optical element having a phase shift preset to attain the desired $T_3$ may be used in place of the quarter wave plate.

When the order of arrangement in the system including the optical parts is changed, the transmission factor $T_3$ of the polarization beamsplitter is set by the quarter wave plate such that the feedback light factor to the emitting point is 1–10% in order to reduce the laser noise.

When the quarter wave plate and the polarization beamsplitter are used, the signal light intensity is obtained with a relatively small laser output.

A method which does not utilize the polarization of the laser beam in order to attain a desired feedback light factor is now explained.

Figure 1B:
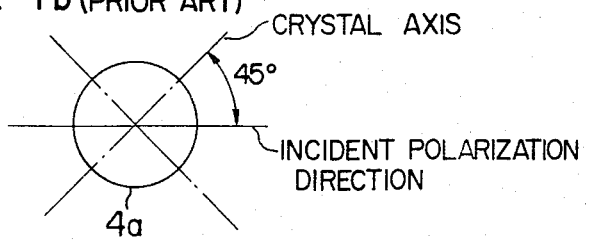
Figure 7:
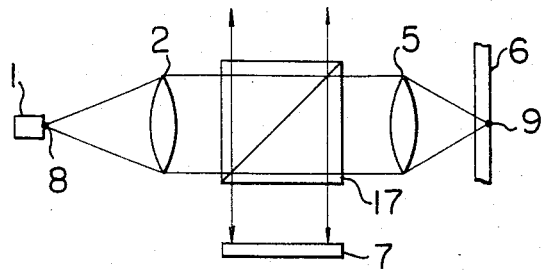
FIG. 7 shows an optical pickup which uses a semitransmissive prism.

In an embodiment of FIG. 7, the quarter wave plate 4 and the polarization beamsplitter 3 of FIG. 1 are substituted by a prism 17 which is subjected to an influence of the polarization and has a specific transmission factor and reflection factor. Such an optical element is hereinafter referred to as a semi-transmissive prism. A desired feedback light factor is attained in the following manner.

$T_{17}$ represents a transmission factor of the semi-transmissive prism to an incident light, and $R_{17}$ represents a reflection factor. A sum of $T_{17}$ and $R_{17}$ is not necessarily unity because of absorption by the semi-transmissive prism. In general, $$R_{17}+T_{17} \leq 1 \quad (8)$$

The light emitted from the semiconductor laser 1 is collimated by the coupling lens 2 and then applied to the semi-transmissive prism 17. Only the $T_{17}$ portion of the incident light transmits to the reflection plane and the $R_{17}$ portion is deflected oppositely to the light detector 7. As the light reflected by the reflection plane 6 reenters the semi-transmissive prism 17, it is split into the transmission light and the reflection light and the light corresponding to $R_{17}$ reaches the light detector 7 while the light corresponding to $T_{17}$ is fed back to the emitting point 8.

Neglecting the loss of the semi-transmissive prism, that is, assuming that $$R_{17}+T_{17}=1$$

and the coupling efficiency $\eta$ is 20% and the other efficiencies of the optical system are same as those described above, the feedback light factor F is given by $$F = \eta \times (1 - L_5)^2 \times (1 - L_2) \times R_6 \times T_{17}^2 \quad (9)$$

$$= 0.17 \times T_{17}^2 \quad (10)$$

When F of 1–10% is desired, the transmission factor $T_{17}$ of the semi-transmissive prism is selected to 22–77%. When F of 2% is desired, $T_3$ is 34%. This is attained by setting the reflection factor $R_{17}$ of the semi-transmissive prism to 66% and the transmission factor $T_{17}$ to 34%.

Figure 8:
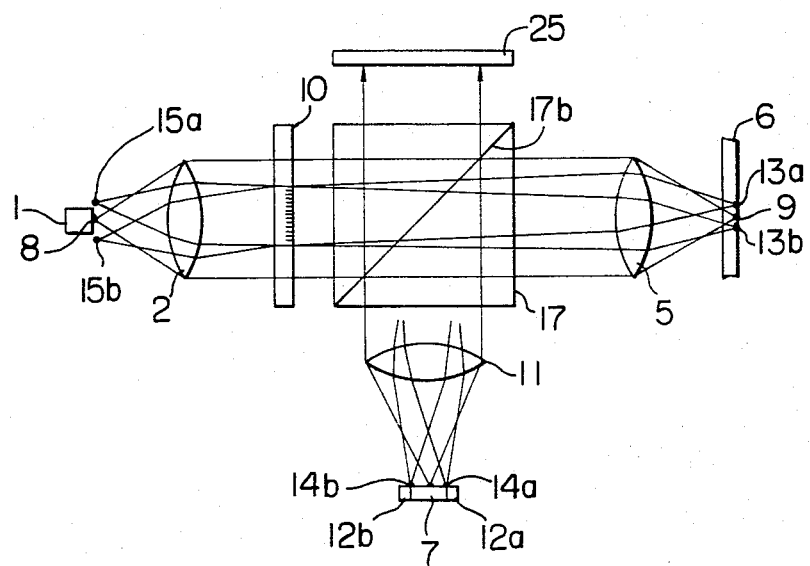
FIG. 8 shows an optical pickup which uses a semi-transmissive prism as a diffractor grid.

FIG. 8 shows an embodiment which uses a semi-transmissive prism. The diffraction grating 10 and the convex lens 11 of FIG. 5 are inserted in the pickup optical system. Assuming that a transmission factor $T_G$ of the 0-order light of the diffraction grating 10 is 70%, the feedback light factor is given by $$F = \eta \times (1 - L_5)^2 \times (1 - L_2) \times R_6 \times T_{17}^2 \times T_G^2 \quad (11)$$

$$= 0.086 \times T_{17}^2 \quad (12)$$

For $F=1\%$, $T_{17}$ is 34%, and for $F=2\%$, $T_{17}$ is 48%. In the latter case, a half-prism having substantially equal transmission factor and reflection factor can be used.

Assuming that the objective lens 5 can be moved in parallel to the disc and the light is attenuated by a factor of approximately 0.6 in the objective lens 5, $T_{17}$ is 63% for $F=2\%$. Thus, the semi-transmissive prism is designed to have the transmission factor of 63% and the reflection factor of 37%.

The semi-transmissive prism 17 may be of one of various constructions. For example, the transmission and the reflection may be controlled by a metal film. It has a disadvantage that the light is absorbed by the metal film and hence the loss is high. An example of non-absorption construction is a dielectric multi-layer film. In general, the multi-layer construction is easy to control only for a certain polarization but difficult to control for the polarization normal thereto. Thus, when the multi-layer film prism is used, it is necessary to adjust the polarization direction of the laser. A distribution of retardation of the disc varies radially because material flow from the center to the periphery during the injection molding. Accordingly, the poralization parallel to a normal line of the disc track or tangential to the disc track is preferable. This is illustrated in FIG. 9.

Figure 9:
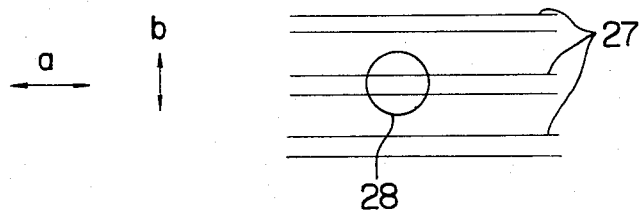
FIG. 9 shows the relation between a track of a disc and a longitudinal direction of light.

Referring to FIG. 9, numeral 27 denotes information tracks on the disc. A spot 28 scans in the direction of the track 27. The polarization direction is preferably parallel or perpendicular to the track 27 in the disc plane as shown by arrows a and b. In order to set the polarization direction relative to the track direction of the disc, the polarization direction of the semiconductor laser is set to a rotation angle parallel or normal in a plane normal to the optical axis.

In the embodiment of FIG. 8, a light detector 25 is used to detect that portion of the light emitted from the laser which is first laterally deflected by the semi-transmissive prism in order to control the laser current.

In order to prevent the light transmitted through the plane 17b of the semi-transmissive prism 17 from being reflected externally, applied again to the plane 17b and reaching the light detector 7, the plane 17b may be a ground glass to scatter the light. For a similar purpose, the plane 17b may be inclined to prevent the light from returning to the light detector 7.

Figure 10A:
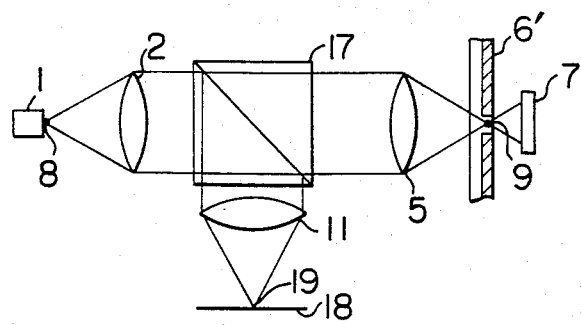
FIGS. 10a and 10b show a transmission type optical disc player pickup which uses a semi-transmissive prism.

While the present invention has been described in connection with the reflection type optical disc player, the present invention can also be applied to a transmission type optical disc player. FIG. 10a shows an embodiment of the present invention applied to the transmission type optical disc player. The light emitted from the semiconductor laser 1 is focused to the spot 9 on the transmission type optical disc 6', and if an information bit exists there, the transmission light therefrom is detected by the light sensor 7. In FIG. 10a, the feedback light to the semiconductor laser 1 is attained by feeding back the light spot focused on a reflection plane 18 other than the disc 6' to the emitting point 8. Assuming that the coupling efficiency $\eta$ of the coupling lens 2 is 20%, the reflector factor $R_{18}$ of the reflection plane 18 is 90%, the loss $L_{11}$ of the convex lens 11 in one way is 1% and the reflection factor of the semi-transmissive prism 17 is $R_{17}$, the feedback light factor F is given by $$F = \eta \times (1 - L_{11})^2 \times (1 - L_2) \times R_{18} \times R_{17}^2 \quad (13)$$

$$= 0.17 \times R_{17}^2 \quad (14)$$

Figure 10B:
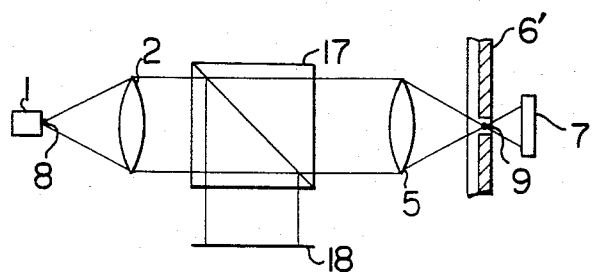

When F of 1-10% is desired, $R_{17}$ is selected to 24-77%. For F=2%, $R_{17}$=34%. In this case, it is necessary that the focal point 9 is on the disc 6' and a focal point 19 is exactly on the reflection plane 18. As shown in FIG. 10b, it is principally possible to eliminate the lens 11 and apply the light beam directly to the reflection plane 18. In this case, however, it is somewhat difficult to exactly feed back the light to the emitting point 8.

For the transmission type pickup, it is possible to control the feedback light by varying the reflection factor $R_{18}$ of the reflection plane 18.

Figure 11:
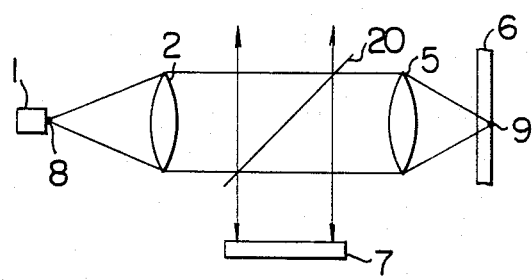
FIG. 11 shows an optical pickup which uses a semi-transparent mirror.

So far, the system which uses the semi-transmissive prism has been described. As shown in FIG. 11, a semi-transmissive mirror plate may be used instead of the prism. In essence, the transmission factor or the reflection factor is controlled to feed back 1-10% of the total emitted light to the emitting point 8 of the semiconductor laser.

When the semi-transmissive prism is used, the quarter wave plate is not necessary and hence a cost is reduced. Since the property of polarization is not utilized, the variation of the reflected light is reduced even if the disc includes the retardation.

Figure 12:
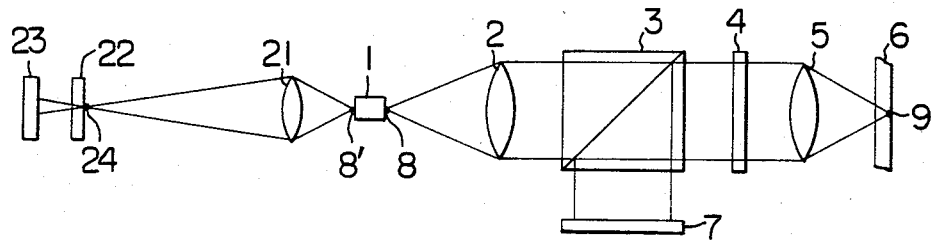
FIG. 12 shows an optical pickup which feeds back light backward of a semiconductor laser.

In the above description, the feedback light is obtained from the front of the semiconductor laser. It is also possible to obtain the feedback light from the rear of the semiconductor laser. FIG. 12 shows an embodiment in which a lens 21 and a semi-transmissive mirror 22 are added to the optical system of FIG. 1 in order to feed back the rear light of the semiconductor laser 1. A spot 24 is formed by the lens 21 on the reflection plane of the semi-transmissive mirror 22 and the reflected light therefrom is fed back to the rear emitting point 8'. The rear light of the semiconductor laser is usually used for monitoring to control the light output. In the present invention, this function is attained by detecting the transmitted light from the semi-transmissive mirror 22 by the light detector 23. Assuming that the numerical aperture of the lens 21 is 0.15, the coupling efficiency $\eta'$ thereof is 20%, the reflection factor of the semi-transmissive mirror 22 is $R_{22}$ and the loss $L_{21}$ of the lens 21 in the return path of the light is 1%, the feedback light factor F is given by $$F = \eta' \times R_{22} \times (1 - L_{21}) \quad (15)$$

$$\approx 0.2 \times R_{22} \quad (16)$$

Accordingly, for F=-10%, the reflection factor $R_{22}$ of the semi-transmissive mirror 22 is selected to 5-50%. For the standard feedback light factor of 2%, $R_{22}$ is selected to 10%. In this case, it is also necessary to adjust the optical system such that the laser beam is exactly focused on a focal point 24 on the reflection plane of the semi-transmissive mirror 22.

When the feedback light is obtained from the rear light of the semiconductor laser, the front optical system such as the polarization beamsplitter 3 and the quarter wave plate 4 may be identical to that of the prior art system. Accordingly, the utilization efficiency of the laser beam is maximized. The arrangement of FIG. 12 and the arrangement described above may be combined so that a desired feedback is attained by both the front light and the back light.

As described hereinabove, according to the present invention, the optical noise in the single longitudinal mode semiconductor laser is significantly reduced by feeding back 1%-10% of the emitted light from the semiconductor laser to the emitting point of the semiconductor laser. As a result, a high quality of signal can be reproduced from the disc.

What is claimed is:

1. In an optical information processing apparatus having a single longitudinal mode semiconductor laser as a light source wherein a continuous light emitted from the light source is transmitted through an optical system and converged on a record medium, a method for reducing an optical noise of a semiconductor laser by feeding back 1%-10% of total emitted light per one facet of said semiconductor laser to an emitting point of said semiconductor laser.

2. A method for reducing an optical noise of a semiconductor laser according to claim 1 wherein said optical system includes a coupling lens, a polarization beamsplitter, a quarter wave plate and an objective lens (5), and said quarter wave plate has its crystal axis set at an angle relative to a direction of incident polarization to said quarter wave plate such that 1%-10% of total emitted light per one facet of said semiconductor laser is fed back to said emitting point of said semiconductor laser.

3. A method for reducing an optical noise of a semiconductor laser according to claim 1 wherein said optical system includes a coupling lens, a diffraction grid, a polarization beamsplitter, a quarter wave plate and an objective lens, and said quarter wave plate has its crystal axis set at an angle relative to a direction of incident polarization to said quater wave plate such that 1%–10% of total emitted light per facet of said semiconductor laser is fed back to said emitting point of said semiconductor laser.

4. A method for reducing an optical noise of a semiconductor laser according to claim 1 wherein said optical system includes a coupling lens, a polarization beamsplitter, a quarter wave plate and an objective lens, said objective lens is movable in parallel to said external record medium and said quarter wave plate has its crystal axis set at an angle relative to a direction of incident polarization to said quarter wave plate such that 1%–10% of total emitted light per facet of said semiconductor laser is fed back to said emitting point of said semiconductor laser.

5. A method for reducing an optical noise of a semiconductor laser according to claim 1 wherein said optical system includes a coupling lens, a diffraction grating, a polarization beamsplitter, a quarter wave plate and an objective lens, said objective lens is movable in parallel to said external record medium, and said quarter wave plate has its crystal axis set at an angle relative to a direction of incident polarization to said quarter wave plate such that 1%–10% of total emitted light per facet of said semiconductor laser is fed back to said emitting point of said semiconductor laser.

6. A method for reducing an optical noise of a semiconductor laser according to claim 1 wherein said optical system includes a coupling lens, a semi-transmissive prism and an objective lens, and said semi-transmissive prism has its transmission rate to said semiconductor laser set such that 1%–10% of total emitted light per facet of said semiconductor laser is fed back to said emitting point of said semiconductor laser.

7. A method for reducing an optical noise of a semiconductor laser according to claim 1 wherein said optical system includes a coupling lens, a diffraction grating, a semi-transmissive prism and an objective lens, and said semi-transmissive prism has its transmission rate to said semiconductor laser set such that 1%–10% of total emitted light per facet of said semiconductor laser is fed back to said emitting point of said semiconductor laser.

8. A method for reducing an optical noise of a semiconductor laser according to claim 1 wherein said optical system includes a coupling lens, a semi-transmissive prism and an objective lens, said objective lens is movable in parallel to said external record medium, and said semi-transmissive prism has its transmission rate to said semiconductor laser set such that 1%–10% of total emitted light per facet of said semiconductor laser is fed back to said emitting point of said semiconductor laser.

9. A method for reducing an optical noise of a semiconductor laser according to claim 1 wherein said optical system includes a coupling lens, a diffraction beamsplitter, a semi-transmissive prism and an objective lens, said objective lens is movable in parallel to said record medium, and said semi-transmissive prism has its transmission rate to said semiconductor laser set such that 1%–10% of total emitted light per facet of said semiconductor laser is fed back to said emitting point of said semiconductor laser.

10. A method for reducing an optical noise of a semiconductor laser according to claim 1 wherein said external record medium is a disc and a polarization direction of said semiconductor laser is set in parallel or normal to a track of said disc.

11. A method for reducing an optical noise of a semiconductor laser according to claim 1 wherein said external record medium is a transmission type optical disc, said optical system includes a coupling lens, a semi-transmissive prism, an objective lens and a reflection plane for generating a feedback light to said semiconductor laser, and said semi-transmissive prism has its transmission rate to said semiconductor laser set such that 1%–10% of total emitted light per one facet of said semiconductor laser is fed back to said emitting point of said semiconductor laser.

12. A method for reducing an optical noise of a semiconductor laser according to claim 1 wherein said optical system includes a lens and a semi-transmissive mirror both for feeding light back using rear light of said semiconductor laser, and said semi-transmissive mirror has its reflection rate such that 1%–10% of total emitted light per one facet of said semiconductor laser is fed back to said emitting point of said semiconductor laser.

13. In an optical information processing apparatus having a single longitudinal mode semiconductor laser as a light source wherein a continuous light emitted from the light source is transmitted through an optical system and converged to a spot on a record medium, an apparatus for reducing an optical noise of a semiconductor laser comprising feedback means for feeding back 1%–10% of total emitted light per facet of said semiconductor laser to an emitting point of said semiconductor laser.

14. An apparatus for reducing an optical noise of a semiconductor laser according to claim 13 wherein said optical system includes a coupling lens, a polarization beamsplitter, a quarter wave plate and an objective lens, and said feedback means sets a crystal axis of said quarter wave plate at an angle relative to a direction of incident polarization to said quarter wave plate such that 1%–10% of total emitted light per facet of said semiconductor laser is fed back to said emitting point of said semiconductor laser.

15. An apparatus for reducing an optical noise of a semiconductor laser according to claim 13 wherein said optical system includes a coupling lens, a diffraction grating, a polarization beamsplitter, a quarter wave plate and an objective lens, and said feedback means sets a crystal axis of said quarter wave plate at an angle relative to a direction of incident polarization to said quarter wave plate such that 1%–10% of total emitted light per facet of said semiconductor laser is fed back to said emitting point of said semiconductor laser.

16. An apparatus for reducing an optical noise of a semiconductor laser according to claim 13 wherein said optical system includes a coupling lens, a polarization beamsplitter, a quarter wave plate and objective lens, said objective lens is movable in parallel to said record medium, and said feedback means sets a crystal axis of said quarter wave plate at an angle relative to a direction of incident polarization to said quarter wave plate such that 1%–10% of total emitted light per facet of said semiconductor laser is fed back to said emitting point of said semiconductor laser.

17. An apparatus for reducing an optical noise of a semiconductor laser according to claim 13 wherein said optical system includes a coupling lens, a diffraction grating, a polarization beamsplitter, a quarter wave plate and an objective lens, said objective lens is movable in parallel to said record medium, and said feedback means sets a crystal axis of said quarter wave plate at an angle relative to a direction of incident polarization to said quarter wave plate such that 1%–10% of total emitted light per facet of said semiconductor laser is fed back to said emitting point of said semiconductor laser.

18. An appratus for reducing an optical noise of a semiconductor laser according to claim 13 wherein said optical system includes a coupling lens, a semi-transmissive prism, and an objective lens, and said feedback means sets a transmission factor of said semi-transmissive prism to said semiconductor laser such that 1%–10% of total emitted light per facet of said semiconductor laser is fed back to said emitting point of said semiconductor laser.

19. An appratus for reducing an optical noise of a semiconductor laser according to claim 13 wherein said optical system includes a coupling lens, a diffraction grating, a semi-transmissive prism, and an objective lens, and said feedback means sets a transmission factor of said semi-transmissive prism to said semiconductor laser such that 1%–10% of total emitted light per facet of said semiconductor laser is fed back to said emitting point of said semiconductor laser.

20. An appratus for reducing an optical noise of a semiconductor laser according to claim 13 wherein said optical system includes a coupling lens, a semi-transmissive prism, and an objective lens, said objective lens is movable in parallel to said record medium, and said feedback means sets a transmission factor of said semi-transmissive prism to said semiconductor laser such that 1%–10% of total emitted light per facet of said semiconductor laser is fed back to said emitting point of said semiconductor laser.

21. An appratus for reducing an optical noise of a semiconductor laser according to claim 13 wherein said optical system includes a coupling lens, a diffraction grating, a semi-transmissive prism, and an objective lens, said objective lens is movable in parallel to said record medium, and said feedback means sets a transmission factor of said semi-transmissive prism to said semiconductor laser such that 1%–10% of total emitted light per facet of said semiconductor laser is fed back to said emitting point of said semiconductor laser.

22. An apparatus for reducing an optical noise of a semiconductor laser according to claim 13 wherein said external reflection plane is a reflection plane of a disc and a polarization direction of said semiconductor laser is set in parallel or normal to a track of said disc.

23. A method for reducing an optical noise of a semiconductor laser according to claim 13 wherein said external record medium is a transmission type optical disc, said optical system includes a coupling lens, a semi-transmissive prism and an objective lens, said feedback means include a reflection plane for generating a feedback light to said semiconductor laser, and said semi-transmissive prism has its transmission index to said semiconductor laser set such that 1%–10% of total emitted light per facet of said semiconductor laser is fed back to said emitting point of said semiconductor laser.

24. A method for reducing an optical noise of a semiconductor laser according to claim 13 wherein said optical system includes a lens and a semi-transmissive mirror both for feeding light back using rear light of said semiconductor laser, and said feedback means is arranged that said semi-transmissive mirror has its reflection index such that 1%–10% of total emitted light per facet of said semiconductor laser is fed back to said emitting point of said semiconductor laser.

25. In an optical information processing apparatus having a single longitudinal mode semiconductor laser as a light source wherein a light emitted from the light source is transmitted through an optical system and converged on a record medium in a light spot on a reflection plane, a method for reducing an optical noise of a semiconductor laser by feeding back from the light spot focused on the reflection plane, 1%–10% of total emitted light per one facet of said semiconductor laser to an emittimg point of said semiconductor laser.

26. A method for reducing an optical noise of a semiconductor laser according to claim 25 wherein said light is a continuous light.

27. In an optical information processing apparatus having a single longitudinal mode semiconductor laser as a light source wherein a light emitted from the light source is transmitted through an optical system and converged on a reflection type record medium in a light spot focused on a reflection plane, a method for reducing an optical noise of a semiconductor laser by feeding back from the light spot focused on the reflection plane of said record medium, 1%–10% of total emitted light per one facet of said semiconductor laser to an emitting point of said semiconductor laser.

28. A method for reducing an optical noise of a semiconductor laser according to claim 27 wherein said light is a continuous light.

29. In an optical information processing apparatus having a single longitudinal mode semiconductor laser as a light source wherein a light emitted from the light source is transmitted through an optical system and converged to a spot on a reflection plane of a record medium, an apparatus for reducing an optical noise of a semiconductor laser comprising feedback means for feeding back from the light spot focused on the reflection plane 1%–10% of total emitted light per facet of said semiconductor laser to an emitting point of said semiconductor laser.

30. An apparatus for reducing an optical noise of a semiconductor laser according to claim 29 wherein said light is a continuous light.

31. In an optical information processing apparatus having a single longitudinal mode semiconductor laser as a light source wherein a light emitted from the light source is transmitted through an optical system and converged to a spot on a reflection plane of a reflection type record medium, an apparatus for reducing an optical noise of a semiconductor laser comprising feedback means for feeding back from the light spot focused on the reflection plane of said record medium, 1%–10% of total emitted light per facet of said semiconductor laser to an emitting point of said semiconductor laser.

32. An apparatus for reducing an optical noise of a semiconductor laser according to claim 31 wherein said light is a continuous light.

* * * * *